United States Patent
Bacchin et al.

(10) Patent No.: US 8,566,670 B2
(45) Date of Patent: Oct. 22, 2013

(54) RAM MEMORY DEVICE SELECTIVELY PROTECTABLE WITH ECC

(75) Inventors: Sergio Bacchin, Osnago (IT); Andre Roger, Munich (DE); Charles Aubenas, Praha (CZ)

(73) Assignees: STMicroelectronics S.r.l., Agrate Brianza (MI) (IT); STMicroelectronics (Grenoble) SAS, Grenoble (FR)

( * ) Notice: Subject to any disclaimer, the term of this patent is extended or adjusted under 35 U.S.C. 154(b) by 126 days.

(21) Appl. No.: 13/192,241

(22) Filed: Jul. 27, 2011

(65) Prior Publication Data

US 2012/0030540 A1    Feb. 2, 2012

(51) Int. Cl.
*G11C 29/00* (2006.01)

(52) U.S. Cl.
USPC .......................... 714/763; 714/758; 714/805

(58) Field of Classification Search
USPC ........................................ 714/758, 763, 805, 9
See application file for complete search history.

(56) References Cited

U.S. PATENT DOCUMENTS

| | | | |
|---|---|---|---|
| 4,965,828 A * | 10/1990 | Ergott et al. .................. | 713/193 |
| 5,509,132 A * | 4/1996 | Matsuda et al. .................. | 711/3 |
| 5,828,593 A * | 10/1998 | Schultz et al. ............. | 365/49.17 |
| 5,995,401 A * | 11/1999 | Schultz et al. ............. | 365/49.17 |
| 6,151,256 A | 11/2000 | Maesako et al. | |
| 6,683,817 B2 * | 1/2004 | Wei et al. ................. | 365/230.03 |
| 7,143,332 B1 | 11/2006 | Trimberger | |
| 2005/0141328 A1 | 6/2005 | Nagai et al. | |

* cited by examiner

*Primary Examiner* — Fritz Alphonse
(74) *Attorney, Agent, or Firm* — Wolf, Greenfield & Sacks, P.C.

(57) ABSTRACT

An SRAM memory device including a plurality of memory cells arranged in a plurality of rows and a plurality of columns; each row of memory cells is adapted to store a RAM word; the RAM word includes a corresponding data word, a corresponding ECC word to be used for error detection and correction purposes and a corresponding applicative word to be used during debugging operations. The SRAM memory device further includes a configurable port adapted to receive a RAM word and to program corresponding memory cells of a selected row based on the received RAM word during a writing access of the SRAM memory device. The SRAM memory device further includes a memory controller unit including circuitry for selectively configuring the configurable port in one among a plurality of modes. The plurality of modes includes a first mode, wherein the configurable port is configured in such a way to disable the programming of the data word and of the corresponding ECC word of the received RAM word and at the same time enable the programming of the applicative word of the received RAM word during the writing access. The plurality of modes includes a second mode, wherein the configurable port is configured in such a way to disable the programming of the applicative word of the received RAM word and at the same time enable the programming of the data word and of the corresponding ECC word of the received RAM word during the writing access.

17 Claims, 1 Drawing Sheet

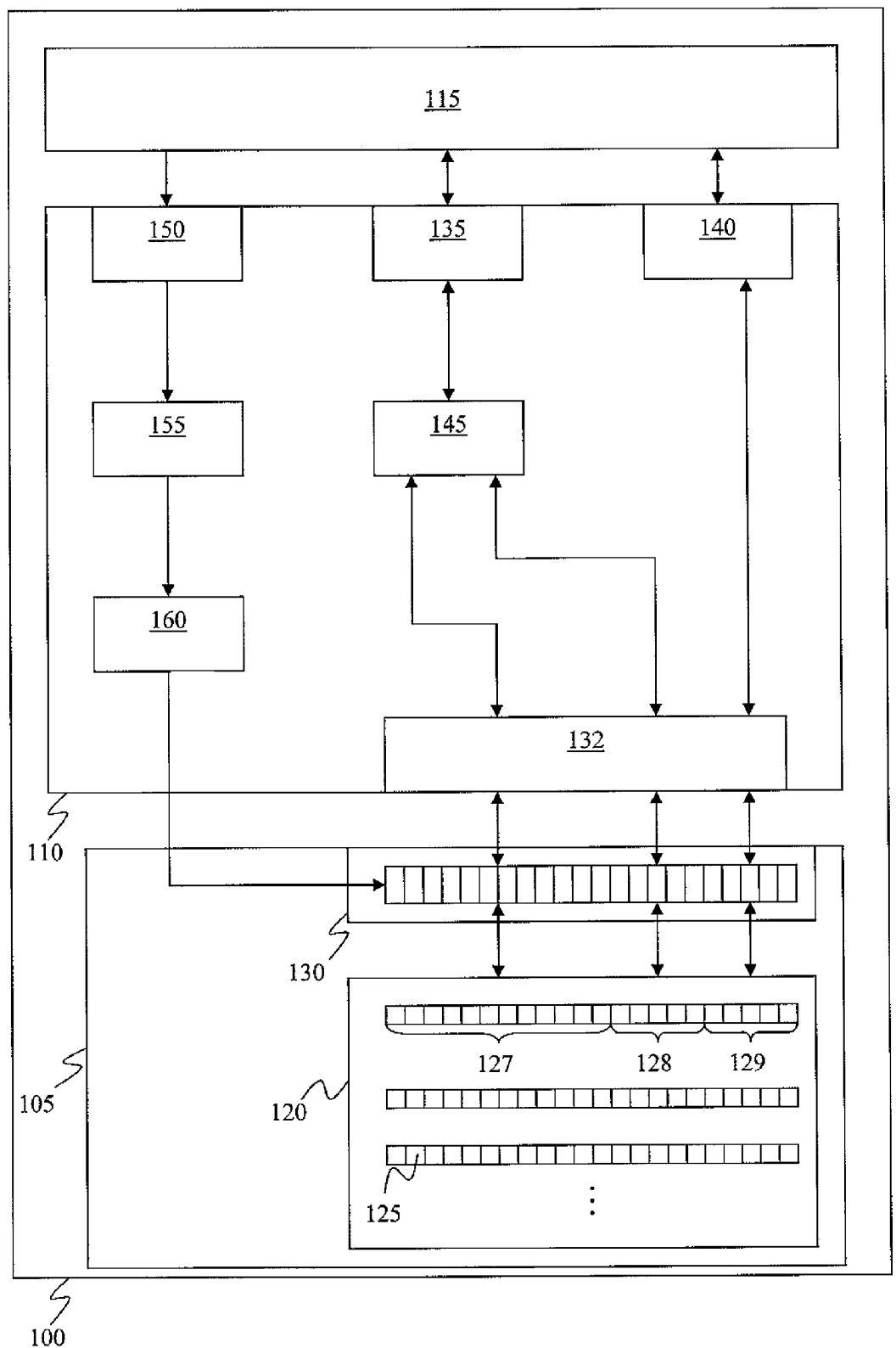

RAM MEMORY DEVICE SELECTIVELY PROTECTABLE WITH ECC

CROSS REFERENCE TO RELATED APPLICATIONS

This application claims the priority benefit of European patent application number 10368031, filed on Jul. 29, 2010, entitled RAM MEMORY DEVICE SELECTIVABLY PROTECTABLE WITH ECC, which is hereby incorporated by reference to the maximum extent allowable by law.

BACKGROUND OF THE INVENTION

1. Field on the Invention

The present invention relates to the field of the electronics, and particularly it relates to random access memory devices provided with error correction capabilities.

2. Discussion of the Related Art

A Random Access Memory (RAM) is a particular type of electronic memory wherein each memory address can be directly accessed with a same access time. A RAM memory includes an array of memory cells, each one of which is capable of storing a binary information or a bit (that is the logical value "0" or "1"), and corresponding peripheral circuits, which in general accomplish management and access functions to each memory cell.

Static RAM memory (SRAM) is a type of volatile RAM memory that does not require any operation for the refresh of the stored data, since the information is stored for a theoretically infinite time (until the shutdown of the electronic system in which such memory is implemented); SRAM memories have reduced access times and relatively low power consumption, especially in static conditions.

Conversely, dynamic RAM memory (DRAM) is a type of volatile RAM memory wherein each bit of data is stored in a separate capacitor. Since capacitors leak charge, the information eventually fades unless the capacitor charge is refreshed periodically. Compared to SRAM, a DRAM has longer access times, but allows to reach higher densities.

In a SRAM memory, each single access involves a plurality of memory cells at the same time. Specifically, during a writing access, a data word formed by a plurality of bits is written into a corresponding group of addressed memory cells. This group includes a number of memory cells equal to the number of bits forming the word to be written; in this way, each bit of the data word is written into a corresponding memory cell of the group. Similarly, during a reading access, an addressed group of memory cells is accessed so as to read a corresponding data word from the memory cells thereof.

SRAM memory devices can be subjected to so-called "soft error" events, i.e., occurrences of unplanned inversions of the logical values stored in the memory cells caused by alpha particles, cosmic rays, thermal neutrons and random electrical noise. Errors due to such events can be solved through soft error correction techniques using proper Error Correction Codes (ECC). Specifically, each word stored in the SRAM memory is associated with corresponding matching redundant data, forming a respective "ECC word". The ECC word is generated by an encoder/decoder unit from the value of the corresponding stored word by using a proper algorithm. As it is well known to those skilled in the art, using the ECC word, it is possible to detect and automatically correct possible unplanned data word variations caused by soft error events. The ECC words are typically stored in memory cells of the array; for this purpose, a portion of the array of memory cells may be specifically dedicated to store the various ECC words.

For example, each row of the array of memory cells may be subdivided in two portions, and specifically a first portion (data portion) including the memory cells adapted to store a data word, and a second portion (ECC portion) including the memory cells adapted to store the corresponding ECC word. Every time a new data word is stored in the data portion of a row, or every time an already stored data word is modified during a writing access, the corresponding ECC word is accordingly updated.

In order to assist the carrying out of debugging operations during the test of the SRAM memory, each data word of the array is associated with auxiliary data, in jargon referred to as "applicative bits". These applicative bits may be used by the debugger in different ways, for example in order to set customizable breakpoints adapted to interrupt the debugging procedure once a certain data word is reached.

According to a first solution known in the art, the applicative bits are stored in a dedicated SRAM memory array, distinct from the one wherein the data words (and the ECC words as well) are stored. However, this solution is very expensive in terms of costs, since it requires the use of two different memory arrays; moreover, in this case additional means (e.g., a lookup table) are required to establish relationships between each data word stored in the first array and the corresponding applicative bits stored in the second array.

According to a further solution known in the art, the applicative bits are stored in dedicated memory cells of the same array wherein the data words and the ECC words are stored. For example, each row of the array of memory cells may be subdivided in three portions, and specifically a first portion (data portion) including memory cells adapted to store the data word, a second portion (ECC portion) including the memory cells adapted to store the corresponding ECC word, and a third portion (applicative portion) including memory cells adapted to store the corresponding applicative bits. However, since the encoder/decoder unit typically generates each ECC word to be stored in the ECC portion of the corresponding row starting from the data stored in the remaining memory cells of the row, the resulting ECC word depends both on the data word (stored in the data portion) and on the applicative bits (stored in the applicative portion). This is disadvantageous, since the ECC words should not be influenced by any application bits modification; in this case, indeed, in order to modify the application bits stored in the applicative portion, the data word stored in the data portion would be previously read, and then, after the modification of the applicative bits, the ECC would be recalculated taking into account both the new application bits and the previously read data word.

Therefore, the Applicant has found that currently known SRAM devices provided with error correction capabilities may be neither cost-effective nor efficient. Generally speaking, the Applicant has found that none of the presently known SRAM devices fulfill at the same time all the following requirements:

- allowing to access the applicative bits independently from the data bits;
- having the applicative bits and the data bits that can be accessed (both in reading and in writing) with a same access time, and
- having a reduced area occupation within the semiconductor chip wherein the memory device is integrated.

SUMMARY OF THE INVENTION

According to an embodiment, the abovementioned requirements can be satisfied by a SRAM memory device as set forth in the appended claim 1. The SRAM memory device includes a plurality of memory cells arranged in a plurality of rows and a plurality of columns; each row of memory cells is adapted to store a RAM word; said RAM word includes a corresponding data word, a corresponding ECC word to be used for error detection and correction purposes and a corresponding applicative word to be used during debugging operations. The SRAM memory device further includes a configurable port adapted to receive a RAM word and to program corresponding memory cells of a selected row based on the received RAM word during a writing access of the SRAM memory device. The SRAM memory device further includes a memory controller unit comprising means for selectively configuring the configurable port in one among a plurality of modes. Said plurality of modes includes a first mode, wherein the configurable port is configured in such a way to disable the programming of the data word and of the corresponding ECC word of the received RAM word and at the same time enable the programming of the applicative word of the received RAM word during the writing access. The plurality of modes includes a second mode, wherein the configurable port is configured in such a way to disable the programming of the applicative word of the received RAM word and at the same time enable the programming of the data word and of the corresponding ECC word of the received RAM word during the writing access.

A further embodiment relates to a method for operating a SRAM memory device.

BRIEF DESCRIPTION OF THE DRAWINGS

These and other features and advantages of the present invention will be made evident by the following description of some exemplary and non-limitative embodiments thereof, to be read in conjunction with the attached drawing, wherein:

FIG. 1 schematically illustrates a SRAM memory device according to an embodiment.

DETAILED DESCRIPTION

Making reference to the drawings, in FIG. 1 there is schematically shown in terms of functional blocks a SRAM memory device 100 according to an embodiment. The SRAM memory device 100 comprises three main units, and specifically a memory unit 105, a memory controller unit 110 (hereinafter, simply referred to as "controller unit") and a main processing unit 115.

The memory unit 105 includes a plurality of memory cells 125, such as the standard SRAM memory cells presently used in the CMOS technologies—i.e., each one including a latch formed by two crossed logic inverters and two access transistors, arranged in rows and columns so as to form a matrix 120.

Each row of the matrix 120 includes a number t (e.g., 42) of memory cells 125 each one adapted to store a respective bit rword[s] (s=0 to t−1) of a corresponding RAM word rword. The t memory cells 125 of each row are subdivided in three respective groups. Particularly:

a first group, referred to as data portion and identified with the reference 127, includes a number n (e.g., 32) of memory cells 125 each one adapted to store a respective bit data[i] (i=0 to n−1) of a data word data;

a second group, referred to as ECC portion and identified with the reference 128, includes a number m (e.g., 7) of memory cells 125 each one adapted to store a respective bit ecc[j] (j=0 to m−1) of an ECC word ecc to be used for error detection and correction purposes, and a third group, referred to as applicative portion and identified with the reference 129, includes a number p (e.g., 3) of memory cells 125 each one adapted to store a respective applicative bit app[k] (k=0 to p−1) of an applicative word app to be used during debugging operations.

In other words, the first n bits of the RAM word rword correspond to the data word data, the next m bits correspond to the ECC word ecc and the last p bits thereof correspond to the applicative word app.

The memory unit 105 further includes a selectively configurable port 130, adapted to receive from the controller unit 110 a RAM word rword to be written into a selected row the matrix 120 during a writing access and provide to the controller unit 110 a RAM word rword stored in a selected row of the matrix 120 during a reading access.

According to an embodiment, the port 130 is selectively configurable by means of a mask word mword generated by the controller unit 110. Specifically, the mask word mword is a digital word including t bits mword[s] (s=0 to t−1) each one corresponding to a bit rword[s] of the RAM word rword. The port 130 is configured to filter the incoming RAM words rword provided by the controller unit 110 during a writing access in the following way:

if the bit mword[s] of the mask word mword is equal to a first value (e.g., the value "0"), then the corresponding bit rword[s] of the incoming RAM word rword is allowed to be written in the corresponding memory cell 125 of the selected row of the array 120, and if the bit mword[s] of the mask word mword is equal to a second value (e.g., the value "1"), then the corresponding bit rword[s] of the incoming RAM word rword is blocked by the port 130, and such bit rword[s] it is not written in the corresponding memory cell 125 of the selected row of the array 120.

The controller unit 110 includes a master interface 132 configured to manage the timing with which the RAM words rword are provided to/received from the port 130 of the memory unit 105 during a writing/reading access.

Moreover, the controller unit 110 further includes a data interface 135 adapted to receive, from the main processing unit 115, a data word data to be written into the data portion 127 of a selected row of the matrix 120 during a writing access and provide to the main processing unit 115 a data word data stored in the data portion 127 of a selected row of the matrix 120 during a reading access.

Similarly, the controller unit 110 includes an applicative interface 140 adapted to receive, from the main processing unit 115, an applicative word app to be written into the applicative portion 129 of a selected row of the matrix 120 during a writing access and provide to the main processing unit 115 an applicative word app stored in the applicative portion 128 of a selected row of the matrix 120 during a reading access.

An ECC controller 145 is coupled between the data interface 135 and the master interface 132 for the generation and the management of the ECC word ecc. Specifically, during a writing access, the ECC controller 145 receives from the data interface 135 a data word data, and accordingly generates a corresponding ECC word ecc. Then, the data word data itself and the ECC word ecc are provided to the master interface 132; the master interface 132 further receives from the applicative interface 140 an applicative word app and accordingly generates from said received data word data, ECC word ecc and applicative word app a RAM word rword to be provided to the port 130. During a reading access, the ECC controller 145 receives, from the master interface 132, both a data word data and an ECC word ecc read from a selected row of the array 120. By comparing the received data word data with the received ECC word ecc, the ECC controller 145 is able to correct possible soft errors affecting the data word data itself, or flag the main processing unit 115 that an error occurred Then, the (possibly corrected) data word data is provided to the data interface 135.

The controller unit 110 further includes a configuration interface 150 adapted to receive, from the main processing unit 115, configuration commands to be provided to a control register 155. As it is well known to those skilled in the art, the control register 155 is adapted to configure the operation of the memory device 100; for example, based on the received configuration commands, the control register 155 may set the memory device 100 to a "safety" condition, in which the memory cells 125 cannot be accessed in writing, or to a condition in which the ECC is disabled.

According to an embodiment, the control register 155 is further adapted to set a mask controller unit 160 adapted to generate the mask word mword. Specifically, based on the received configuration commands, the control register may set the memory device 100 into a selected one among the two following operation modes:

1) A so-called "applicative bits editing mode", in which the bits stored in memory cells 125 belonging to the data portions 127 and to the ECC portions 128 of each row cannot be modified, but instead the bits stored in memory cells 125 belonging to the applicative portions 129 are allowed to be written. Therefore, in this operation mode, it is possible to modify the applicative bits app[k] of an applicative word app without having to involve the corresponding data word data and ECC word ecc.

2) A so-called "data bits editing mode", in which the bits stored in memory cells 125 belonging to the data portions 127 and to the ECC portions 128 of each row can be modified, but instead the bits stored in memory cells 125 belonging to the applicative portions 129 do not. Therefore, in this operation mode, the bits data[i] of a data word data, and the bits ecc[j] of the corresponding ECC word ecc can be modified without having to involve the corresponding applicative word app.

In the applicative bits editing mode, the mask controller unit 160 sets the first n+m bits mword[s] of the mask word mword to the second value (1), and the remaining bits mword[s] of the mask word mword to the first value (0). In this way, during a writing access, the only portion of the RAM word rword provided to the port 130 that is actually written— in the memory cells of the applicative portion 129 of a selected row—is the one corresponding to the applicative word app.

Conversely, in the data bits editing mode, the mask controller unit 160 sets the first n+m bits mword[s] of the mask word mword to the first value (0), and the remaining bits mword[s] of the mask word mword to the second value (1). In this way, during a writing access, the only portion of the RAM word rword provided to the port 130 that is actually written— in the memory cells of the data portion 127 and ECC portion 128 of a selected row—is the one corresponding to the data word data and to the ECC word ecc.

In this, way, thanks to the proposed solution, the applicative bits can be modified independently from the data bits; moreover, the ECC word associated to the data word stored in the corresponding row should not be recalculated each time the applicative bits are modified. Therefore, with the proposed solution, the applicative bits and the data bits are accessed with a same access time. In addition, implementing the proposed solution does not require any excessive waste of semiconductor area, since it simply requires the addition of a mask controller and a configurable port.

The previous description presents and discusses in detail several embodiments of the present invention; nevertheless, several changes to the described embodiments, as well as different invention embodiments are possible, without departing from the scope defined by the appended claims.

For example, according to a further embodiment, the applicative bits editing mode may allow a selective masking of each applicative bit forming the applicative word; in other words, instead of setting all the bits of the mask word mword corresponding to the applicative word app to the first value, it is possible to selectively avoid the modification of some applicative bits app[k] of the applicative word app by properly set the corresponding bits of the mask word mword to the second value.

Moreover, according to a still further embodiment of the present invention, a so-called "mixed data/applicative bits editing mode" is provided, in which both the applicative bits and the data bits can be modified at the same time; in this case, all the bits of the mask word mword are set to the first value.

In addition, for safety reasons the controller unit may be password-protected, in such a way to avoid any undesired and unauthorized editing of the control register.

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A Static Random Access Memory (SRAM) memory device comprising:
   a plurality of memory cells arranged in a plurality of rows and a plurality of columns, each row of memory cells being adapted to store a Random Access Memory (RAM) word, said RAM word including a corresponding data word, a corresponding Error Correction Code (ECC) word to be used for error detection and correction purposes and a corresponding applicative word to be used during debugging operations,
   a configurable port adapted to receive a RAM word and to program corresponding memory cells of a selected row based on the received RAM word during a writing access of the SRAM memory device,
   a memory controller unit comprising means for selectively configuring the configurable port in one among a plurality of modes, said plurality of modes including:
   a first mode, wherein the configurable port is configured in such a way to disable the programming of the data word and of the corresponding ECC word of the received RAM word and at the same time enable the programming of the applicative word of the received RAM word during the writing access, and
   a second mode, wherein the configurable port is configured in such a way to disable the programming of the applicative word of the received RAM word and at the same time enable the programming of the data word and of the corresponding ECC word of the received RAM word during the writing access.

2. The SRAM memory device of claim 1, wherein each row of memory cells is subdivided in a first group of memory cells adapted to store a corresponding data word, a second group of memory cells adapted to store a corresponding ECC word and a third group of memory cells adapted to store a corresponding applicative word, the means for selectively configuring the configurable port includes means for:
- enabling the programming of the memory cells belonging to the third group and at the same time disabling the programming of the memory cells belonging to the first and second groups, and
- enabling the programming of the memory cells belonging to the first and second groups and at the same time disabling the programming of the memory cells belonging to the third group.

3. The SRAM memory device of claim 2, wherein each memory cell of a row is adapted to store a corresponding bit of the incoming RAM word during a writing access, the means for selectively configuring the configurable port includes means for generating a mask word including a plurality of mask bits, each mask bit being associated to a respective bit of the RAM word, and wherein, for each mask bit of the mask word:
- if the mask bit is equal to a first logic value, the respective bit of the incoming RAM word is programmed in the corresponding memory cell of the row, and
- if the mask bit is equal to a second logic value opposite to the first, the respective bit of the incoming RAM word is not programmed in the corresponding memory cell of the row.

4. The SRAM memory device of claim 1, wherein said plurality of modes further includes a third mode, wherein the configurable port is configured in such a way to enable the programming of the whole received RAM word during the writing access.

5. A method for operating a Static Random Access Memory (SRAM) memory device, the SRAM memory device including plurality of memory cells arranged in a plurality of rows and a plurality of columns, each row of memory cells being adapted to store a Random Access Memory (RAM) word, said RAM word including a corresponding data word, a corresponding Error Correction Code (ECC) word to be used for error detection and correction purposes and a corresponding applicative word to be used during debugging operations, the method including:
- providing a RAM word to be programmed in corresponding memory cells of a selected row to a configurable port based on the received RAM word;
- selectively configuring the configurable port so as to perform one among a plurality of operations, said plurality of operations including:
- disabling the programming of the data word and of the corresponding ECC word of the received RAM word and at the same time enabling the programming of the applicative word of the received RAM word during the writing access, and
- disabling the programming of the applicative word of the received RAM word and at the same time enabling the programming of the data word and of the corresponding ECC word of the received RAM word during the writing access.

6. A memory device comprising:
- an array of memory cells arranged in rows and columns, each row of memory cells configured to store a memory word, each memory word including at least one first word and at least one second word;
- a configurable port arranged to write to selected memory cells of a selected row during writing to the array of memory cells; and
- a memory controller unit arranged to selectively configure the configurable port, in response to a first configuration command, to disable writing of the at least one first word to the selected row and to enable writing of the at least one second word to the selected row.

7. A memory device as defined in claim 6, wherein the memory controller unit is further arranged to selectively configure the configurable port, in response to a second configuration command, to disable writing of the at least one second word to the selected row and to enable writing of the at least one first word to the selected row.

8. A memory device as defined in claim 7, wherein the at least one first word comprises a data word and an error correction code word, and wherein the at least one second word comprises an applicative word.

9. A memory device as defined in claim 6, wherein the memory controller unit is arranged to generate a mask word including a plurality of mask bits, each mask bit being associated with a respective bit of the memory word and wherein, for each mask bit of the mask word, if the mask bit is equal to a first logic value, the respective bit of the memory word is written in the corresponding memory cell of the selected row, and, if the mask bit is equal to a second logic value, the respective bit of the memory word is not written in the corresponding memory cell of the selected row.

10. A memory device as defined in claim 6, wherein the memory controller unit is arranged to selectively configure the configurable port to enable writing of the at least one first word and the at least one second word to the selected row.

11. A memory device as defined in claim 9, wherein the memory controller unit is arranged to selectively mask bits of the at least one second word.

12. A method for operating a memory device, the memory device including an array of memory cells arranged in rows and columns, each row of memory cells configured to store a memory word, each memory word including at least one first word and at least one second word, comprising:
- providing to a configurable port of the memory device a memory word to be written to a selected row of memory cells; and
- selectively configuring the configurable port, in response to a first configuration command, to disable writing of the at least one first word to the selected row and to enable writing of the at least one second word to the selected row.

13. A method for operating a memory device as defined in claim 12, further comprising selectively configuring the configurable port, in response to a second configuration command, to disable writing of the at least one second word to the selected row and to enable writing of the at least one first word to the selected row.

14. A method for operating a memory device as defined in claim 13, wherein the at least one first word comprises a data word and an error correction code word and wherein the at least one second word comprises an applicative word.

15. A method for operating a memory device as defined in claim 13, wherein selectively configuring the configurable port comprises generating a mask word including a plurality of mask bits, each mask bit being associated with a respective bit of the memory word and wherein, for each mask bit of the mask word, if the mask bit is equal to a first logic value, the respective bit of the memory word is written in the corresponding memory cell of the selected row, and if the mask bit is equal to a second logic value, the respective bit of the memory word is not written to the corresponding memory cell of the selected row.

16. A method for operating a memory device as defined in claim 12, wherein selectively configuring the configurable port further includes enabling writing of the at least one first word and the at least one second word to the selected row.

17. A method for operating a memory device as defined in claim 15, wherein selectively configuring the configurable port comprises selectively masking bits of the at least one second word.

* * * * *

UNITED STATES PATENT AND TRADEMARK OFFICE
CERTIFICATE OF CORRECTION

| | | |
|---|---|---|
| PATENT NO. | : 8,566,670 B2 | Page 1 of 1 |
| APPLICATION NO. | : 13/192241 | |
| DATED | : October 22, 2013 | |
| INVENTOR(S) | : Sergio Bacchin et al. | |

It is certified that error appears in the above-identified patent and that said Letters Patent is hereby corrected as shown below:

On the title page, Item (30) should read:
(30)       Foreign Application Priority Data
Jul. 29, 2010       (EP)..................10368031.0

Signed and Sealed this
Tenth Day of December, 2013

Margaret A. Focarino
*Commissioner for Patents of the United States Patent and Trademark Office*